(12) United States Patent
Yin et al.

(10) Patent No.: US 8,466,013 B2
(45) Date of Patent: Jun. 18, 2013

(54) METHOD FOR MANUFACTURING A SEMICONDUCTOR STRUCTURE

(75) Inventors: Haizhou Yin, Poughkeepsie, NY (US); Huilong Zhu, Poughkeepsi, NY (US); Zhijiong Luo, Poughkeepsi, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 7 days.

(21) Appl. No.: 13/381,075

(22) PCT Filed: Aug. 25, 2011

(86) PCT No.: PCT/CN2011/078887
§ 371 (c)(1),
(2), (4) Date: Dec. 27, 2011

(87) PCT Pub. No.: WO2013/000197
PCT Pub. Date: Jan. 3, 2013

(65) Prior Publication Data
US 2013/0001691 A1    Jan. 3, 2013

(30) Foreign Application Priority Data
Jun. 30, 2011 (CN) .......................... 2011 1 0183555

(51) Int. Cl.
H01L 21/283 (2006.01)
(52) U.S. Cl.
USPC ........... 438/149; 438/151; 438/479; 438/517; 438/586; 257/E21.242
(58) Field of Classification Search
USPC ................. 438/586, 149, 151, 311, 479, 517; 257/E21.242
See application file for complete search history.

(56) References Cited

U.S. PATENT DOCUMENTS

| 6,649,964 | B2* | 11/2003 | Kim ............................... 257/308 |
| 2002/0119608 | A1* | 8/2002 | Ko et al. ........................ 438/152 |
| 2006/0049467 | A1* | 3/2006 | Lim et al. ..................... 257/383 |
| 2011/0031541 | A1* | 2/2011 | Fung ............................ 257/288 |

* cited by examiner

*Primary Examiner* — Thanh Nguyen
(74) *Attorney, Agent, or Firm* — Enshan Hong; VLP Law Group LLP

(57) ABSTRACT

The present invention provides a method for manufacturing a semiconductor structure, which comprises: providing an SOI substrate, and forming a gate structure on the SOI substrate; etching an SOI layer and a BOX layer of the SOI substrates on both sides of the gate structure, so as to form trenches exposing the BOX layer and extending partially into the BOX layer; forming metal sidewall spacers on sidewalls of the trenches, wherein the metal sidewall spacers is in contact with the SOI layer under the gate structure; forming an insulating layer filling partially the trenches, and forming a dielectric layer to cover the gate structure and the insulating layer; etching the dielectric layer to form first contact through holes that expose at least partially the insulating layer, and etching the insulating layer from the first contact through holes to form second contact through holes that expose at least partially the metal sidewall spacer; filling the first contact through holes and the second contact through holes to form contact vias, which are in contact with the metal sidewall spacers. The method provided by the present invention is capable of improving performance of semiconductor devices and alleviating manufacturing difficulty at the mean time.

12 Claims, 9 Drawing Sheets

METHOD FOR MANUFACTURING A SEMICONDUCTOR STRUCTURE

CROSS REFERENCE TO RELATED APPLICATION

This application is a National Phase application of, and claims priority to, PCT Application No. PCT/CN2011/078887, filed on Aug. 25, 2011, entitled "SEMICONDUCTOR STRUCTURE AND METHOD FOR MANUFACTURING THE SAME", which claimed priority to Chinese Application No. 201110183555.0, filed on Jun. 30, 2011. Both the PCT Application and Chinese Application are incorporated herein by reference in their entireties.

FIELD OF THE INVENTION

The present invention relates to semiconductor manufacturing field, particularity, to a semiconductor structure and a method for manufacturing the same.

BACKGROUND OF THE INVENTION

With the development in the semiconductor manufacturing industry, integrated circuits with better performance and more powerful functions require greater element density, and sizes of and spaces between components have to be further scaled down (which has already reached the nanometer level nowadays). Accordingly, various micro effects come up along with scaling down of sizes of semiconductor devices. In order to meet the demands in developing semiconductor devices, persons skilled in the art are dedicated to exploring new manufacturing processes.

Silicon-On-Insulator (SOI) devices exhibit good feature of dielectric isolation, thus integrated circuits made of SOI exhibits merits such as small parasitic capacitance, high integration, fast operation speed, simple manufacturing process and alleviated short-channel effect. An SOI substrate usually consists of three layers of main structures, which are respectively a body silicon layer, a Buried Oxide layer (BOX layer) on the body silicon layer, and an SOI layer lying on the BOX layer, the material of which usually is mono-crystalline silicon.

In the prior art, processes of recessed source/drain regions are employed in manufacturing a semiconductor device with aforesaid SOI substrate, such as the semiconductor structure shown in FIG. 1. A specific method for forming the structure shown in FIG. 1 is as follow: etching an SOI substrate first, specifically, etching an SOI layer 10 and a BOX layer 11 between a gate structure 15 and isolation regions of the SOI substrate, so as to form a trench extending to the BOX layer; then, filling a semiconductor material into the trench to form a semiconductor layer 14; and finally forming source/drain regions within the semiconductor layer 14.

However, aforesaid semiconductor structure has following defects: as shown in FIG. 1, when a dielectric layer 17 is etched to form contact vias to the source/drain regions in subsequent processes, high controlling capability for etching is required, because the source/drain regions on the semiconductor layer 14 have to be aligned in one aspect, and the gate structure 15 should be protected from damage in another aspect. For a semiconductor structure with a metal gate, capacitances exist between the metal gate and the contact vias, which accordingly affects the performance of the semiconductor device. At formation of the contact vias to the source/drain regions, scaled down device size and limited contact area between bottoms of the contact vias and the source/drain regions cause relatively large contact resistance, which shall also affect the performance of the semiconductor device.

SUMMARY OF THE INVENTION

The present invention aims to provide a semiconductor structure and a method for manufacturing the same, so as to reduce contact resistances at the source/drain regions, to reduce capacitance between the contact vias to the source/drain regions and the metal gates, and to alleviate etching difficulty at formation of contact through holes.

In one aspect, the present invention provides a method for manufacturing a semiconductor structure, which comprises:
a) providing an SOI substrate, and forming a gate structure on the SOI substrate;
b) etching an SOI layer and a BOX layer of the SOI substrate at both sides of the gate structure, to form trenches that expose the BOX layer and partially extend into the BOX layer;
c) forming metal sidewall spacers on sidewalls of the trench, wherein the metal sidewall spacers come into contact with the SOI layer under the gate structure;
d) forming an insulating layer that partially fills the trenches, and forming a dielectric layer that covers the gate structure and the insulating layer;
e) etching the dielectric layer to form first contact through holes that at least partially expose the insulating layer, and etching the insulating layer from the first contact through holes to form second contact through holes that at least partially expose the metal sidewall spacers;
f) filling the first contact through holes and the second contact through holes to form contact vias, which are in contact with the metal sidewall spacers.

In another aspect, the present invention further provides a method for manufacturing a semiconductor structure, which comprises:
a) providing an SOI substrate, and covering the SOI substrate with a mask; wherein gate lines are to be formed in the covered region defined by the mask;
b) etching an SOI layer and a BOX layer of the SOI substrate at both sides of the mask to form trenches that expose the BOX layer and partially extend into the BOX layer;
c) forming metal spacers at sidewalls of the trenches; wherein the metal sidewall spacers are in contact with the SOI layer under the region covered by the mask;
d) removing the mask to expose the region that it covers, forming a gate structure on said region, and forming an insulating layer that partially fills the trenches;
e) forming a dielectric layer that covers the gate structure and the insulating layer;
f) etching the dielectric layer to form first contact through holes that at least partially expose the insulating layer, and etching the insulating layer from the first contact through holes to form second contact through holes that at least partially expose the metal sidewall spacer;
g) filling the first contact through holes and the second contact through holes to form contact vias, which are in contact with the metal sidewall spacers.

Accordingly, the present invention further provides a semiconductor structure, which comprises an SOI substrate, a gate structure, metal sidewall spacer, a dielectric layer and contact vias; wherein:
the SOI substrate comprises an SOI layer and a BOX layer;
the gate structure is formed on the SOI layer;

the metal sidewall spacers are formed within the SOI substrates at both sides of the gate structure, are in contact with the SOI layer under the gate structure, and extend into the BOX layer;

the dielectric layer covers the SOI substrate and the metal sidewall spacers; the contact vias extend through the dielectric layer and extend into the BOX layer, and the contact vias come into contact with the metal sidewall spacers.

The present invention provides a semiconductor structure and a method for manufacturing the same, which lies in forming first trenches extending to a BOX layer on an SOI substrate, then forming metal sidewall spacers on the sidewalls of the trenches, and finally forming contact vias in contact with the metal sidewall spacers; wherein such advantages are achieved: the contact vias are in direct contact with the metal sidewall spacers, thus the contact resistances at the source/drain regions are rather small, which is favorable for enhancing performance of the semiconductor device; as the source/drain regions are formed within the SOI layer under the gate structure, thus a distances lies between the gate and source/drain regions, and the small capacitance between the two also is favorable for enhancing performance of the semiconductor device; additionally, self-alignment is achieved at formation of the contact vias, which thus alleviate the difficulty for manufacturing the semiconductor device.

BRIEF DESCRIPTION OF THE DRAWINGS

Other characteristics, objectives and advantages of the present invention are made more evident according to perusal of the following detailed description of exemplary embodiment(s) in conjunction with accompanying drawings.

Same or similar reference signs in the accompanying drawings denote same or similar elements.

DETAILED DESCRIPTION OF THE INVENTION

Figure 1:
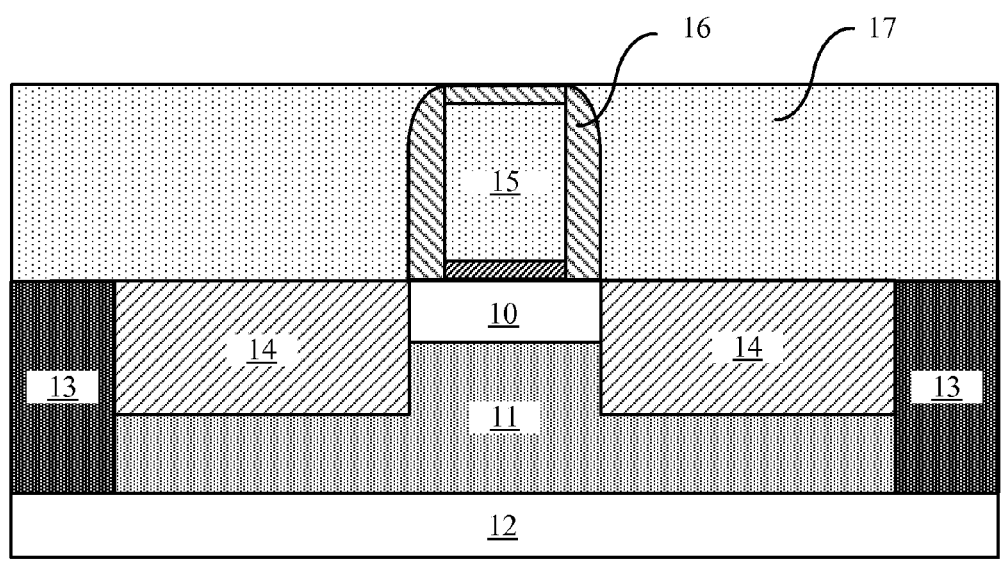
FIG. 1 illustrates a cross-sectional structure diagram of a semiconductor structure manufactured according to the prior art.

Objectives, technical solutions and advantages of the present invention are made more evident according to the following detailed description of exemplary embodiments in conjunction with the accompanying drawings.

Embodiments of the present invention are described here below, wherein the examples of the embodiments are illustrated in the drawings, in which the same or similar reference signs throughout denote the same or similar elements or elements have same or similar functions. It should be appreciated that the embodiments described below in conjunction with the drawings are illustrative, and are provided for explaining the prevent invention only, thus shall not be interpreted as a limit to the present invention.

Various embodiments or examples are provided here below to implement different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purpose of simplification and clearness, yet does not denote the relationship between respective embodiments and/or arrangements being discussed. Furthermore, the present invention provides various examples for various process and materials. However, it is obvious for a person of ordinary skill in the art that other processes and/or materials may alternatively be utilized. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other.

A preferred embodiment of a semiconductor structure provided by the present invention is firstly described here below; with reference to FIG. 11, which illustrates a cross-sectional structure diagram of a device according to an embodiment of the semiconductor structure provided by the present invention; the semiconductor structure comprises an SOI substrate, a gate structure 200, metal sidewall spacers 60, a dielectric layer 300 and contact vias 330; wherein:

the SOI substrate comprises an SOI layer 100 and a BOX layer 110;

the gate structure 200 is formed on the SOI layer 100;

the metal sidewall spacers 160 are formed within the SOI substrates on both sides of the gate structure 200, and the metal sidewall spacers 160 are in contact with the SOI layer 100 under the gate structure 200 and extend into the BOX layer 110;

the dielectric layer 300 covers the SOI substrate and the metal sidewall spacers 160; the contact vias 330 penetrate through the dielectric layer 300 and extend into the BOX layer 110; wherein the contact vias 330 are in contact with the metal sidewall spacers 160.

Usually, the gate structure 200 further comprises sidewall spacers 210, which are formed on both sides of the gate structure 200.

In another embodiment, metal sidewall spacers 160 also lie between the contact vias 330 and isolation regions 120 of the SOI substrate.

The SOI substrate consists of at least three layers, which are respectively: a body silicon layer 130, a BOX layer 110 on the body silicon layer 130, and an SOI layer covering the BOX layer 110. $SiO_2$ is usually selected as the material for the BOX layer 110, whose thickness is usually greater than 100 nm; the materials for the SOI layer 100 is mono-crystalline silicon, Ge or compounds of III-V families; the SOI substrate used in the present embodiment is an SOI substrate with an ultrathin SOI layer 100, therefore, the thickness of the SOI layer 100 is usually less than 100 nm, for example, 50 nm. Usually, isolation regions 120 are further formed in the SOI substrate to separate the SOI layer 100 as independent regions, which are used subsequently for manufacturing and forming transistor structures; the material of the isolation regions 120 is an insulating material which, for example, may be $SiO_2$, $Si_3N_4$ or their combination. The width of the isolation regions 120 may be in dependence on the designing demand of a semiconductor structure.

The gate structure 200 comprises a gate dielectric layer and a gate stack. The sidewall spacers 210 may be formed from a material selected from a group consisting of $Si_3N_4$, $SiO_2$, $Si_2N_2O$, SiC and other material, or combinations thereof, as appropriate. The sidewall spacers 210 may be in a multi-layer structure. The sidewall spacers 210 may be formed through depositing-etching process, in a thickness of about 10 nm-100 nm.

The materials for the metal sidewall spacers 160 include metallic materials of good conductivity, for example a material selected from a group consisting of W, Al, TiAl, and TiN, or combinations thereof; the material of the contact vias 330 is preferably Al, yet it may be another material, for example a material selected from a group consisting of W, Al, TiAl, and TiN, or combinations thereof. The metal sidewall spacers 160 may function as the source and drain regions of a transistor structure to be formed, even portions of the contact vias in direct contact with the metal sidewall spacers 160 may be regarded as portions of the source and drain regions.

Preferably, the upper surface of the gate structure 200 is at the same level with the upper surface of the contact vias 330 (herein, the term "at the same level" indicates that the difference between the heights of the two is in the range of permitted technical error).

According to the manufacturing needs, the same semiconductor device may comprise aforesaid embodiment or any other semiconductor structure as appropriate.

Aforesaid embodiment is further described here below in conjunction with methods for manufacturing a semiconductor structure provided by the present invention.

With reference to FIG. 2(a), which illustrates a flowchart of a method for manufacturing a semiconductor structure according to an embodiment of the present invention; wherein the method comprises:

at step S101, providing an SOI substrate and forming a gate structure on the SOI substrate;

at step S102, etching an SOI layer and an BOX layer of the SOI substrates on both sides of the gate structure, so as to form trenches that expose the BOX layer and partially extend into the BOX layer;

at step S103, forming metal sidewall spacers on sidewalls of the trenches, wherein the metal sidewall spacers are in contact with the SOI layer under the gate structure;

at step S104, forming an insulating layer that partially fills the trenches, and forming a dielectric layer to cover the gate structure and the insulating layer;

at step S105, etching the dielectric layer to form first contact through holes that at least partially expose the insulating layer, and etching the insulating layer from the first contact through holes to form second contact through holes that at least partially expose the metal sidewall spacers;

at step S106, filling the first contact through holes and the second contact through holes to form contact vias, which are in contact with the metal sidewall spacers.

Step S101 through step S106 are described below in conjunction with FIG. 3 to FIG. 11, which illustrate cross-sectional structural diagrams of a semiconductor structure at respective manufacturing stages of the method according to the flowchart shown in FIG. 2(a) of the present invention. It is noteworthy that the drawings for the respective embodiments are illustrative only, thus are not drawn strictly to scale.

Figure 3:
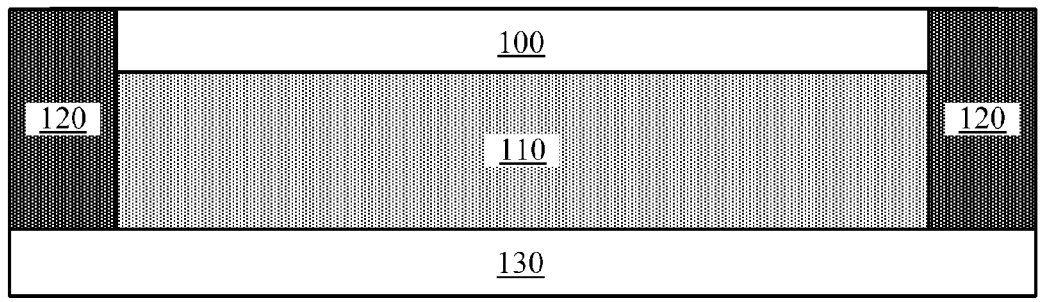
FIG. 3 to FIG. 11 illustrate cross-sectional structural diagrams of a semiconductor structure at respective stages of the method for manufacturing a semiconductor structure according to the flowchart shown in FIG. 2 (a) of the present invention.
Figure 4:
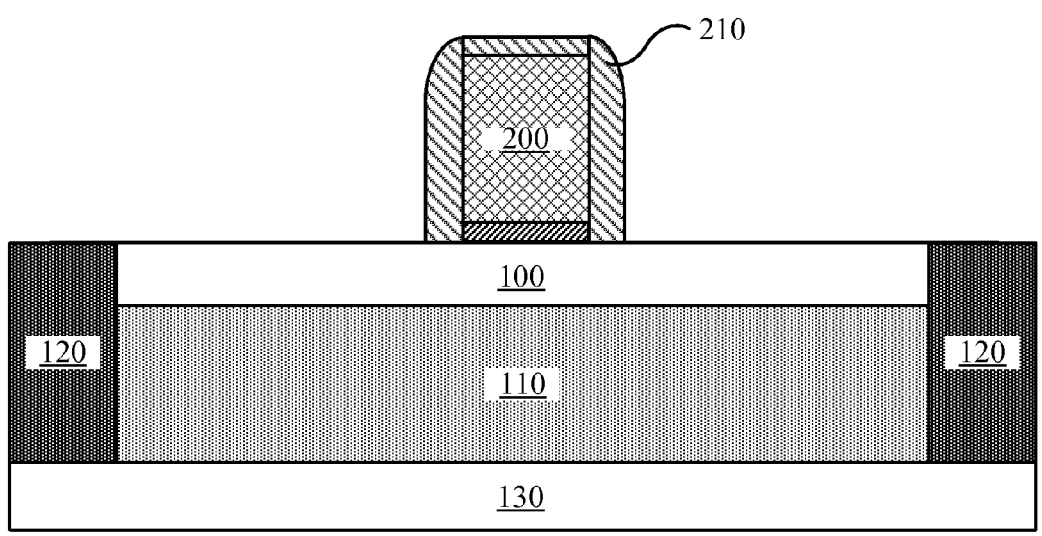

With reference to FIG. 3 and FIG.4, step S101 is implemented to provide an SOI substrate and to form a gate structure 200 on the SOI substrate.

First, with reference to FIG. 3, the SOI substrate at least consists of three layers, which are respectively: a body silicon layer 130, a BOX layer 110 on the body silicon layer 130, and an SOI layer 100 on top of the BOX layer 110. $SiO_2$ is usually selected as the material of the BOX layer 110, whose thickness is usually greater than 100 nm; the material of the SOI layer 100 is mono-crystalline silicon, Ge or compounds of III-V families; the SOI substrate used in the present embodiment is an SOI substrate with an ultrathin SOI layer 100, thus the thickness of the SOI layer 100 is usually less than 100 nm, for example, 50 nm. Usually, isolation regions 120 are further formed within the SOI substrate to separate the SOI layer into independent regions, which are used for manufacturing and forming transistor structures in subsequent processes; the material of the isolation regions 120 is an insulating material which, for example, may be $SiO_2$, $Si_3N_4$ or their combination; the width of the isolation regions 120 may be in dependence on the demand in designing a semiconductor structure.

Then, with reference to FIG. 4, a gate structure 200 is formed on the SOI substrate; in a Gate-First process, the formation of the gate structure 200 goes as below: forming a gate dielectric layer on top of the SOI layer 100 and the isolation regions 120, a gate metal layer on top of the gate dielectric layer, a gate electrode layer on top of the gate metal layer, an oxide on top of the gate electrode layer, a nitride layer on top of the oxide layer, and a photoresist layer covering the nitride layer and patterned for etching out a gate stack; wherein, the material of the gate dielectric layer may be a thermal oxide layer, including $SiO_2$ or $Si_2N_2O$, or may be a high-k dielectric, for example, a material selected from a group consisting of $HfO_2$, HfSiO, HfSiON, HfTaO, HfSiO, HfZrO, $Al_2O_3$, $La_2O_3$, $ZrO_2$, and LaAlO, or combinations thereof, with a thickness in the range of 1 nm~4 nm; the material of the gate metal layer may be a material selected from a group consisting of TaC, TiN, TaTbN, TaErN, TaYbN, TaSiN, HfSiN, MoSiN, $RuTa_x$ and NiTa, or combinations thereof, with a thickness in the range of 5 nm~20 nm; Poly-Si may be selected as the material for the gate electrode layer, whose thickness is in the range of 20 nm~80 nm; the material of the oxide layer is $SiO_2$, whose thickness is in the range of 5 nm~10 nm; the material of the nitride layer is $Si_3N_4$, whose thickness is in the range of 10 nm~50 nm; the material of the photoresist layer may be a vinyl monomer material, a material including quinone azide compound or a material of Polyethylene monolaurate or the like. Except the photoresist layer in the abovementioned multi-layer structure, other layers therein may he formed on the SOI layer 100 sequentially by means of Chemical Vapor Deposition, High-density Plasma CVD, ALD, Plasma Enhanced Atomic Layer Deposition, Pulsed Laser Deposition or other method as appropriate. After the photoresist layer is patterned, aforesaid multi--layer structure may be etched to form a gate structure 200 as shown in FIG. 3.

In a Gate-Last process, the gate structure 200 comprises a dummy gate and a gate dielectric layer carrying the dummy gate; thus it is applicable to implement gate replacement process in subsequent steps, where the dummy gate is removed to form a desired gate stack structure.

Usually, the gate structure 200 further comprises sidewall spacers 210, which are formed on both sides of the gate structure 200 for isolating the gate structure 200. The sidewall spacers 200 may be formed from a material selected from a group consisting of $Si_3N_4$, $SiO_2$, $Si_2N_2O$, SiC and other material, or combinations thereof, as appropriate. The sidewall spacers 210 may be in a multi-layer structure. The sidewall spacers 210 may be formed through depositing-etching process, with a thickness in the range of about 10 nm-100 nm.

Figure 5:
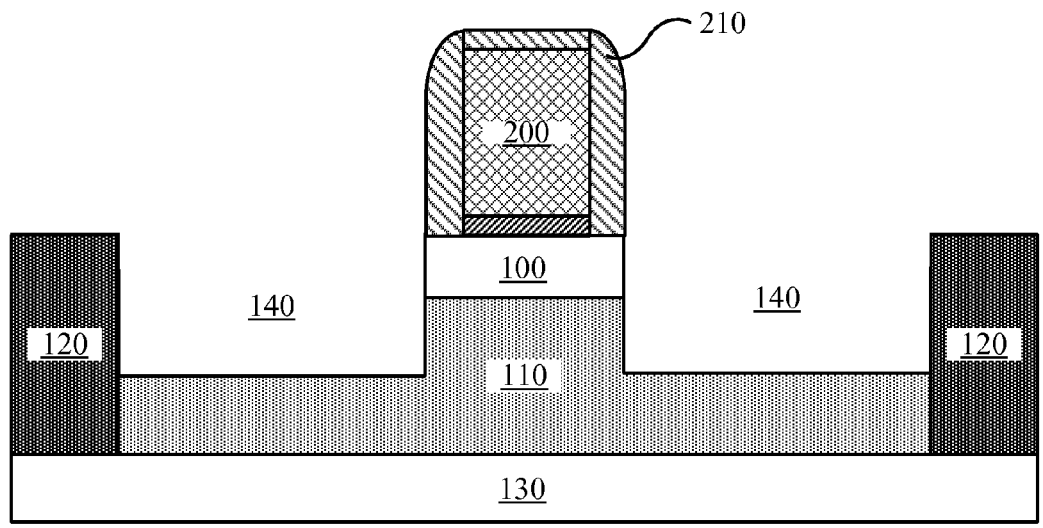

With reference to FIG. 5, step S102 is implemented to etch an SOI layer 100 and a BOX layer 110 of the SOI substrates on both sides of the gate structure 200, so as to form trenches 140 that expose the BOX layer and at least partially extend into the BOX layer 110. Specifically, the SOI layers 100 on both sides of the gate structure 200 are removed first through an etching process as appropriate, then portions of the exposed BOX layers 110 are removed to form the trenches 140, which therefore not only expose the remaining portions of the BOX layers 110 and partially replace the un-etched BOX layer 110 in the sense of space, but also partially extend into the BOX layer 110. The trenches 140 are as deep as the sum of the thickness of the SOI layer 100 etched away and the thickness of the BOX layer 110 etched away; in view of the SOI substrate used in the present embodiment, the thickness of the BOX layer 110 is usually greater than 100 nm, and the thickness of the Ultrathin SOI layer 100 is 20 nm~30 nm, accordingly, the depth of the trenches 140 is in the range of 50 nm~150 nm.

Figure 6:
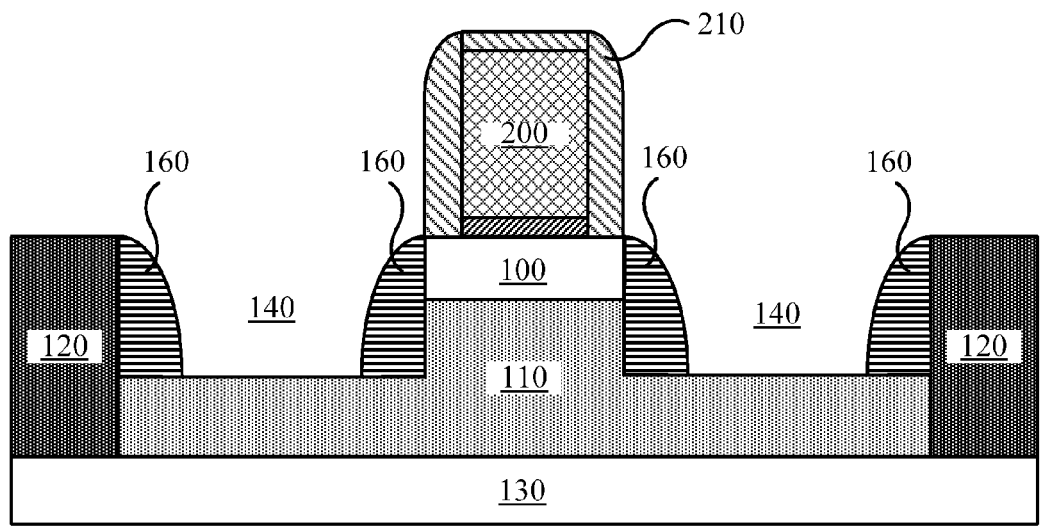

With reference to FIG. 6, step S103 is implemented to form metal sidewall spacers 160 on sidewalls of the trenches 140, wherein the metal sidewall spacers 160 are in contact with the SOI layer 100 under the gate structure 200. In the present embodiment, the trenches 140 are quite wide and partially expose the isolation regions 120. As shown in FIG. 6, the metal sidewall spacers 160 in the present embodiment are formed on the sidewalls of the trenches 140 neighboring the gate structure 200 and on the exposed sidewalls of the isolation regions 120. In another embodiment, the trenches 140 formed are not very wide and do not expose the isolation regions 120, thus the metal sidewall spacers 160 are formed only on the sidewalls of the trenches neighboring the gate structure 200. The metal sidewall spacers 160 may be formed through a deposition method as appropriate; preferably, the material of the metal sidewall spacers 160 includes metal materials of good conductivity, for example a material selected from a group consisting of W, Al, TiAl, and TiN, or combinations thereof.

Figure 7:
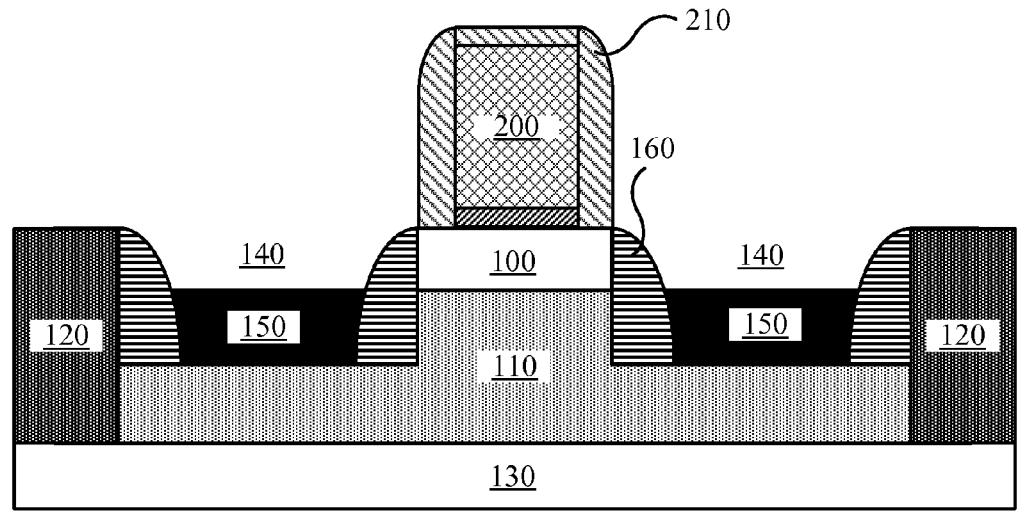
Figure 8:
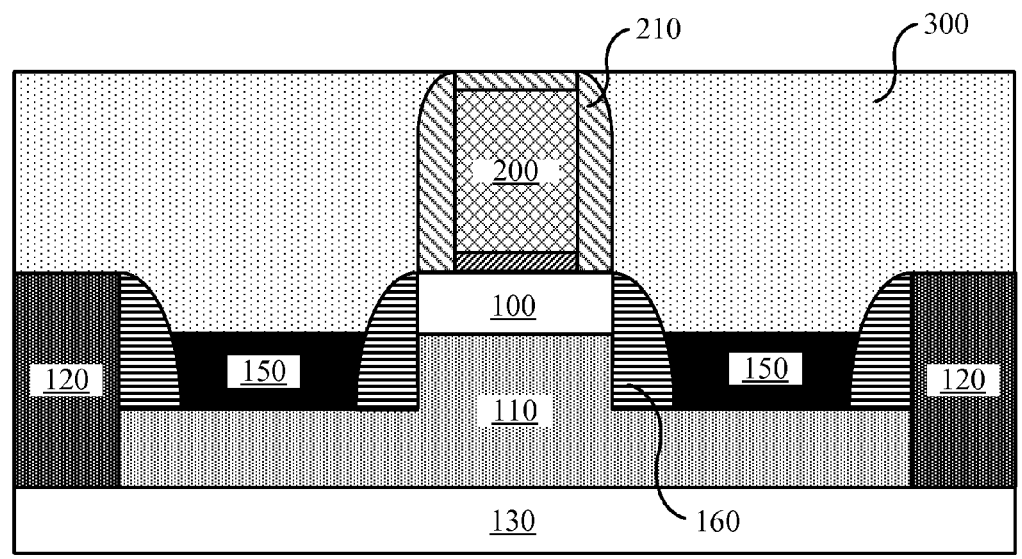

With reference to FIG. 7 to FIG. 8, step S104 is implemented to form an insulating layer 150 partially filling the trenches 140, and to form a dielectric layer 300 to cover the gate structure 200 and the insulating layer 150. Specifically, as shown in FIG. 7, the insulating layer 150 may be formed first by means of Chemical Vapor Deposition, High-density Plasma CVD, ALD, Plasma Enhanced Atomic Layer Deposition, Pulsed Laser Deposition or other method as appropriate; the insulating layer 150 usually just fills the lower portions of the trenches 140 and stops at the surface of the metal sidewall spacers 160; $SiO_2$ is usually selected for the material of the insulating layer 150. Then, as shown in FIG. 8, the dielectric layer 300 is formed by means of CVD, High-density Plasma CVD, Spin Coating or other method as appropriate; the dielectric layer 300 fully fills the upper portions of the trenches 140, and covers the insulating layer 150 and the gate structure 200; the material of the dielectric layer 300 may be a material selected from a group consisting of $SiO_2$, carbon-doped $SiO_2$, BPSG, PSG, UGS, $Si_2N_2O$, SiC, and low-k materials, or combinations thereof. In the present embodiment, after the dielectric layer 300 has been formed, the dielectric layer 300 may be planarized by means of chemical-mechanical polish, such that the upper surface of the dielectric layer 300 is at the same level with the upper surface of the gate structure 200; after the dielectric layer 300 treated through the CMP process, the thickness of the dielectric layer 300 is usually in the range of 40 nm~150 nm, for example, 80 nm, 100 nm or 120 nm.

Preferably, the material of the insulating layer 150 is different from the material of the dielectric layer 300, thus the two exhibit different etch rates. The arrangement of selecting such materials is favorable for etching at step S105.

Figure 9:
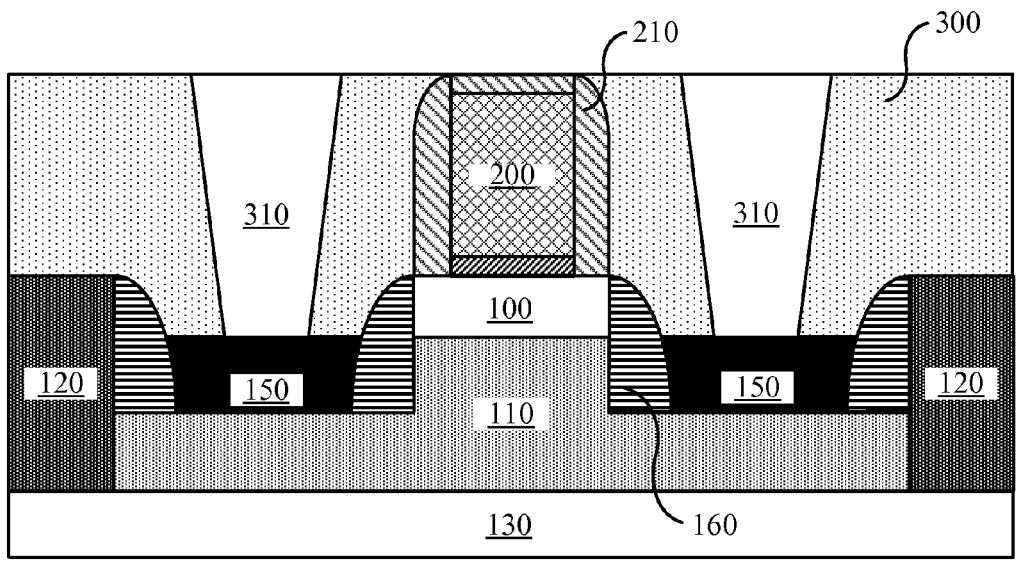
Figure 10:
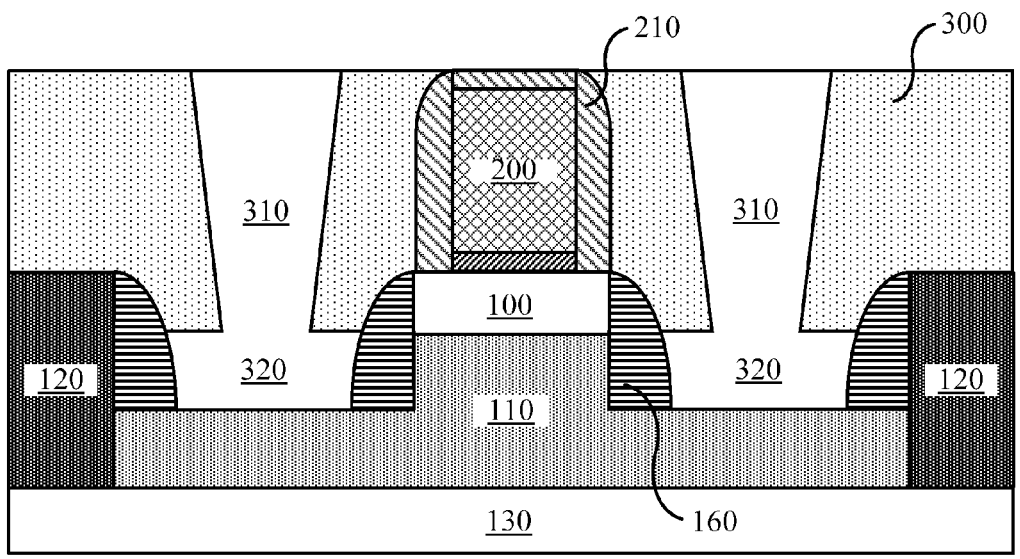

In view of aforesaid arrangement, reference is now made to FIG. 9 to FIG. 10, step S105 is implemented to etch the dielectric layer 300 to form first contact through holes 310 that at least partially expose the insulating layer 150, and to etch the insulating layer 150 from the first contact through holes 310 to form second contact through holes 320 that at least partially expose the metal sidewall spacers 160. With reference to FIG. 9 first, since the dielectric layer 300 and the insulating layer 150 are made from different materials, when the dielectric layer 300 is etched to form the first contact through holes 310, the etching is stopped substantially at the upper surface of the insulating layer 150, and the first contact through holes 310 at least partially expose the insulating layer 150. The process applied to etch the dielectric layer 300 to form the first contact through holes 310 may be a conventional lithography process, but should be dry etching. Next, with reference to FIG. 10, wet etching is performed from the first contact through holes 310 to selectively etch and remove at least a portion of the insulating layer 150; after removal of at least a portion of the insulating layer 150, second contact through holes 320 are formed in the place occupied by the insulating layer 150 previously; the second contact through holes 320 at least partially expose the metal sidewall spacers 160 formerly covered by the insulating layer 150.

Figure 11:
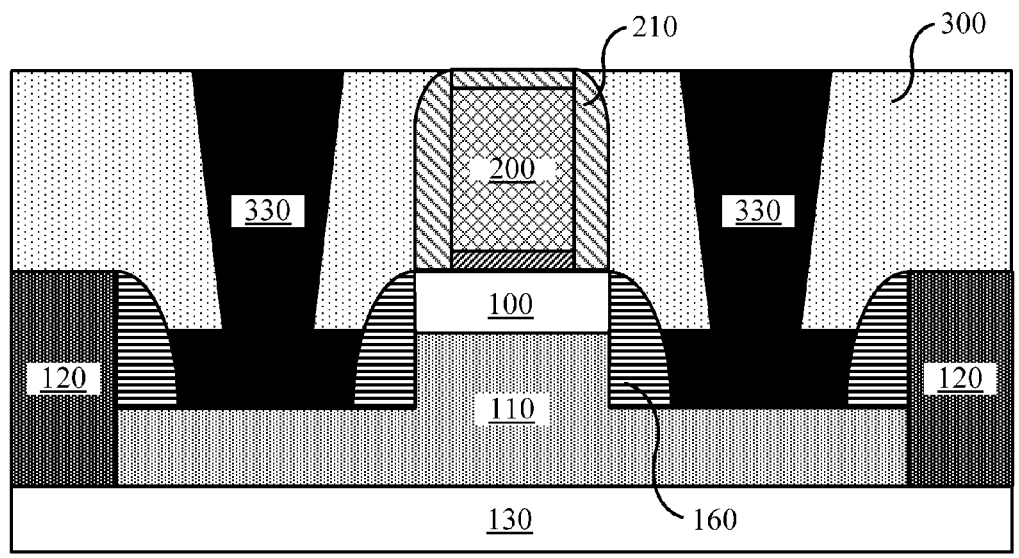

With reference to FIG. 11, step S106 is implemented to fill the first contact through holes 310 and the second contact through holes 320 to form contact vias 330, which are in contact with the metal sidewall spacers 160. Specifically, a metal material is selected to fill the first contact through holes 310 and the second contact through holes 320; preferably, the metal material may be Al, which is heated up into liquid state to flow through the first contact through holes 310 into the second contact through holes 320 and to fully fill the second contact through holes 320 and the first contact through holes 310 sequentially, so as to form the contact vias 330 that are embedded into the dielectric layer 300 and partially extend into the BOX layer 110. Since the second contact through holes 320 expose the metal sidewall spacers 160, thus the contact vias 330 come into contact with the metal sidewall spacers 160. In other embodiments, the contact vias 330 may be formed from other metal materials as appropriate, for example, a material selected from a group consisting of W, Al, TiAl, and TiN, or combinations thereof.

In the present embodiment, the second contact through holes 320 are always formed by way of etching away the insulating layer 150 from the first contact through holes 310, then a metal is filled therein to form contact vias 330 that is in contact with the metal sidewall spacers 160; therefore, only if the second contact through holes 320 expose the metal sidewall spacer 160, the contact vias 330 should be easily in contact and electrically connected with the metal sidewall spacers 160 during its formation. Accordingly, self-alignment is fulfilled during formation of the contact vias 330 as compared to the prior art, which thus reduces the technical difficulty.

Figure 2:
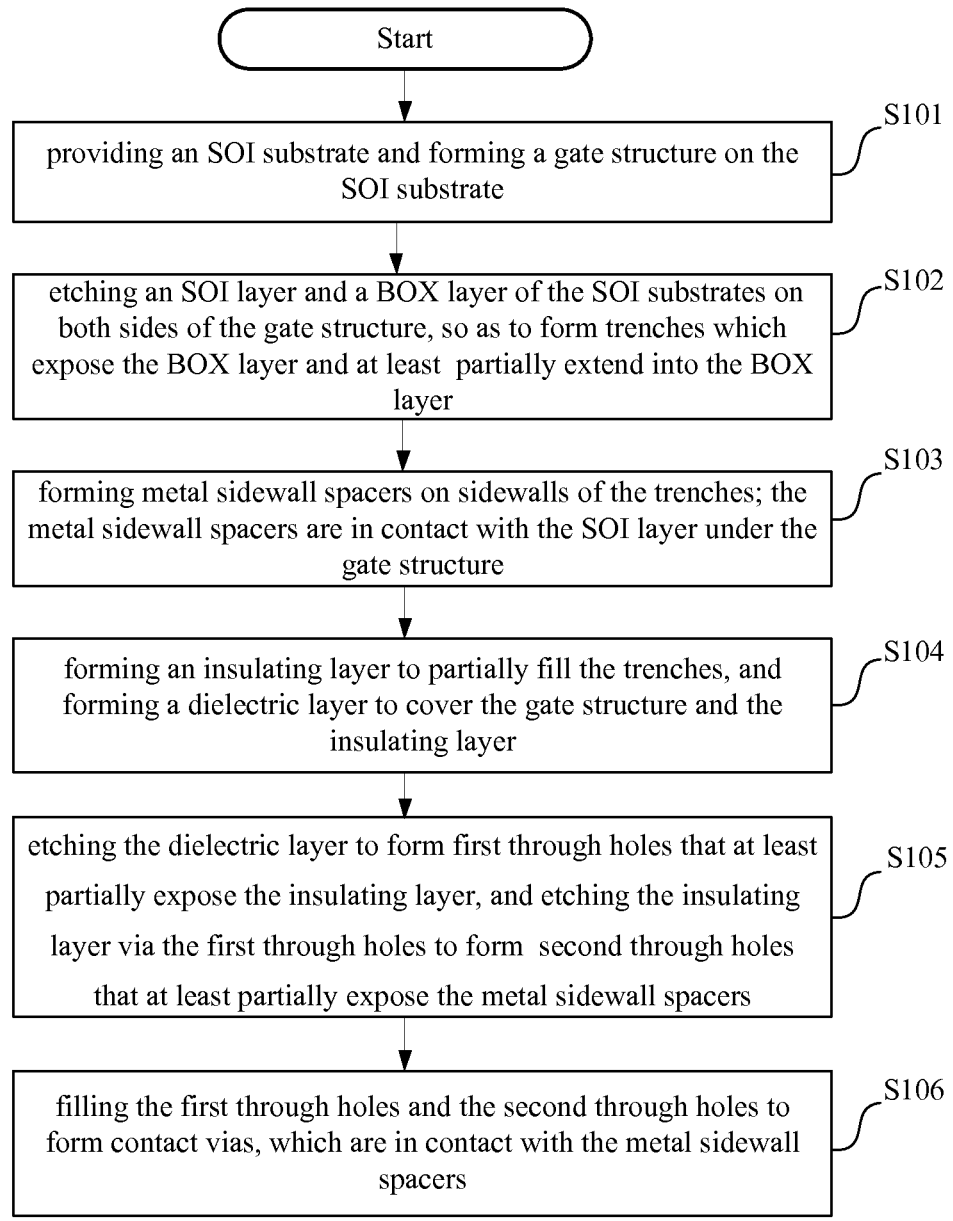
FIG. 2(a) illustrate a flowchart of a method for manufacturing a semiconductor structure according to an embodiment of the present invention.
FIG. 2(b) illustrate a flowchart of another method for manufacturing a semiconductor structure according to another embodiment of the present invention.
Figure 2B:
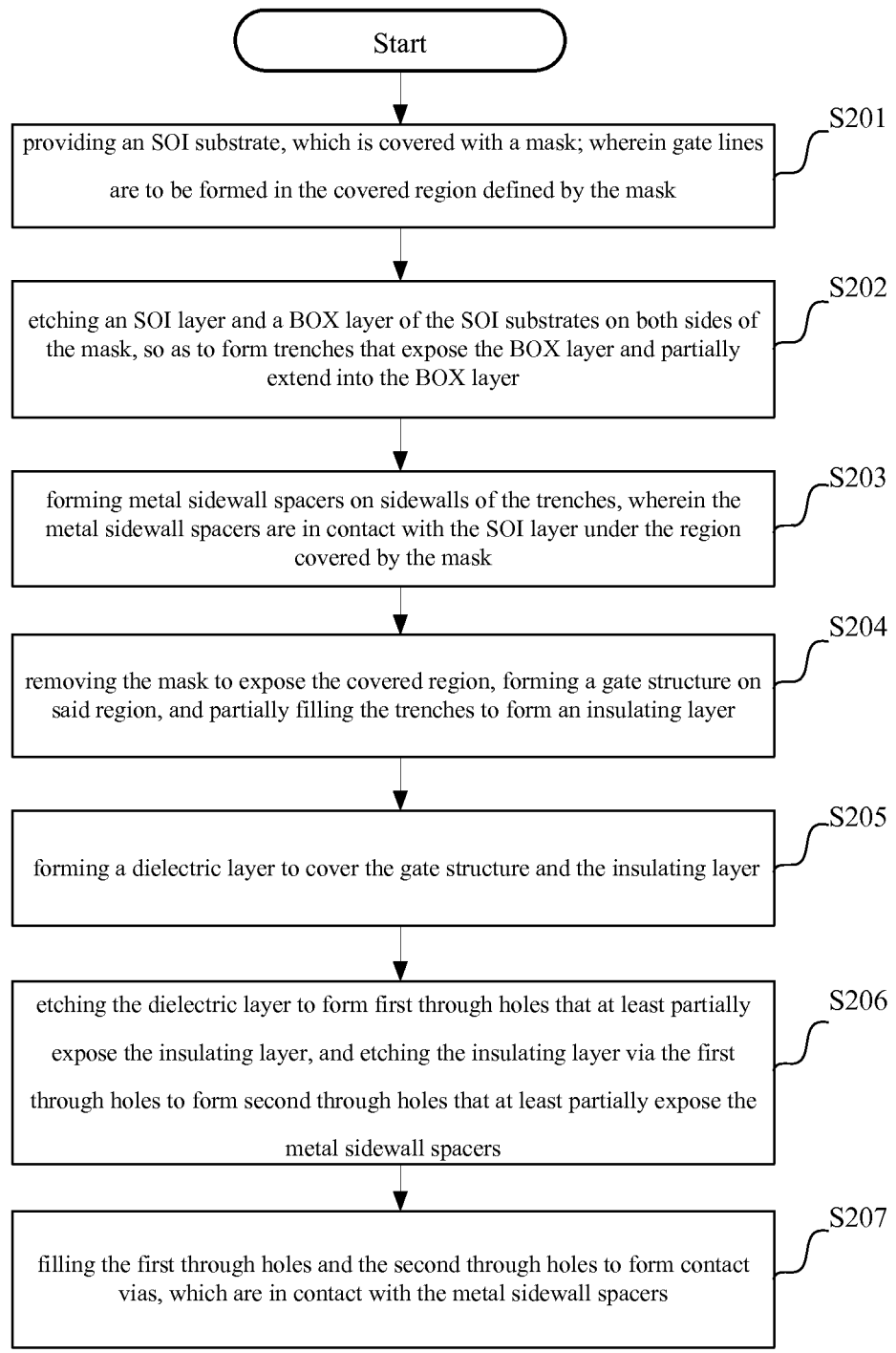

Turn to refer FIG. 2 (b), which shows a flowchart of another method for manufacturing a semiconductor structure according to another embodiment of the present invention; the method comprises:

at step S201, providing an SOI substrate, which then is overlaid with a mask; wherein gate lines are to be formed in the covered region defined by the mask;

at step S202, etching an SOI layer and a BOX layer of the SOI substrates on both sides of the mask, to form trenches that expose the BOX layer and partially extend into the BOX layer;

at step S203, forming metal sidewall spacers on sidewalls of the trenches, wherein the metal sidewall spacers are in contact with the SOI layer under the regions covered by the mask;

at step S204, removing the mask to expose the covered region, forming a gate structure on said region, and partially filling the trenches to form an insulating layer (150);

at step S205, forming a dielectric layer that covers the gate structure and the insulating layer;

at step S206, etching the dielectric layer to form first contact through holes that at least partially expose the insulating layer, and etching the insulating layer from the first contact through holes to form second contact through holes that at least partially expose the metal sidewall spacers;

at step S207, filling the first contact through holes and the second contact through holes to form the contact vias, which are in contact with the metal sidewall spacers.

Figure 12:
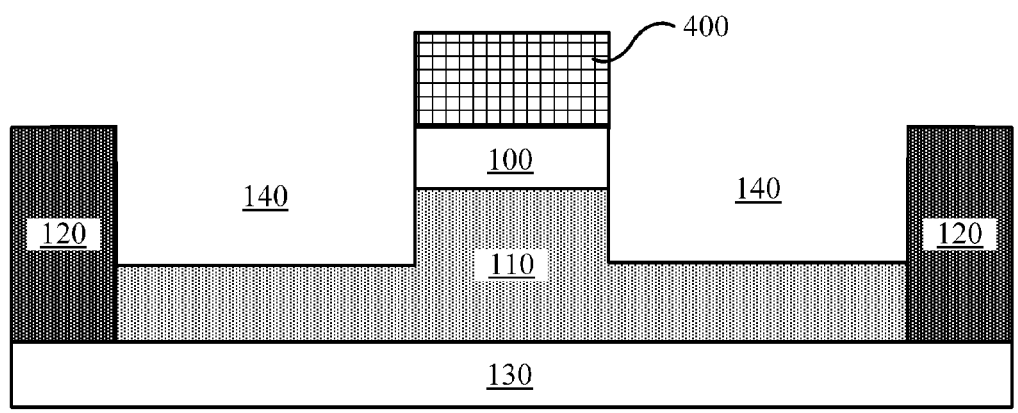
FIG. 12 to FIG. 14 illustrate cross-sectional structural diagrams of a semiconductor structure at respective stages of the method for manufacturing a semiconductor structure according to the flowchart shown in FIG. 2 (b) of the present invention.
Figure 13:
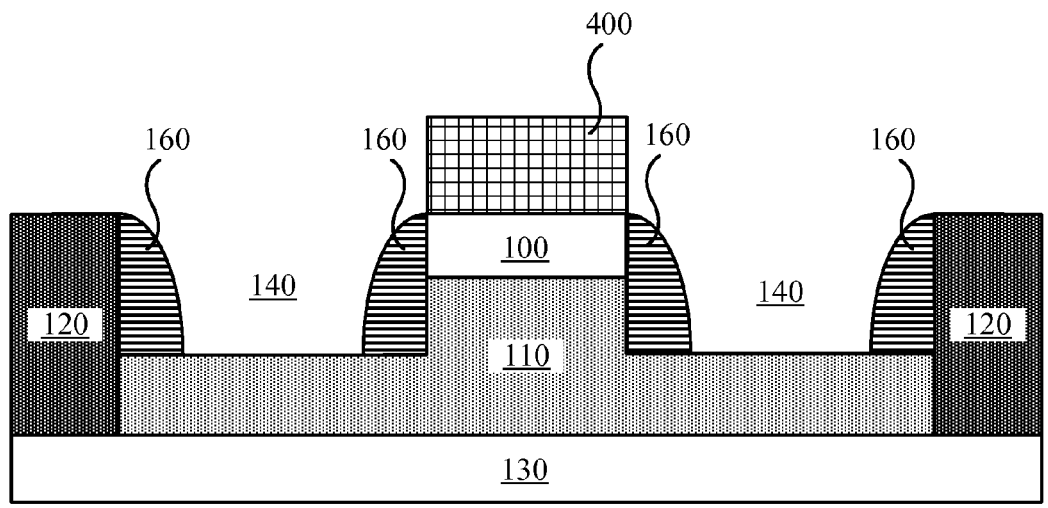
Figure 14:
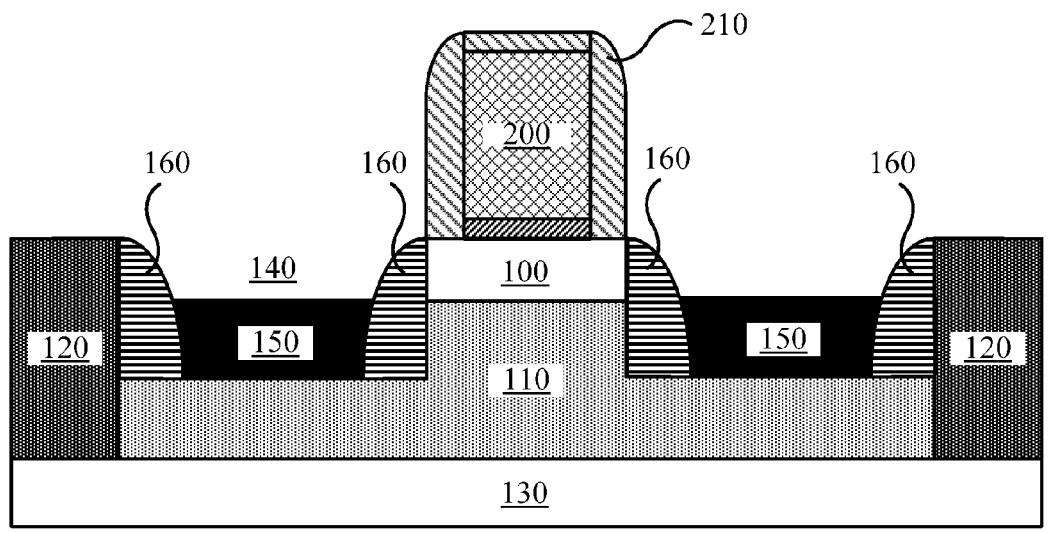

Steps 201 through S204 are described in conjunction with FIG. 12 to FIG. 14, which illustrate a cross-sectional structure diagram of a semiconductor structure at respective manufacturing stages according to the flowchart shown in FIG. 2 (b). It is noteworthy that, the drawings of respective embodiments are provided for illustration only, thus are not necessarily drawn to scale.

The method shown in FIG. 2 (b) differs from the method shown in FIG. 2 (a) in that: with regard to the flowchart shown in FIG. 2 (a), a gate structure is formed first on a substrate, then trenches 140 are formed through etching, metal sidewall spacers 160 are formed within the trenches 140, and then subsequent processes, for example forming an insulating layer 150 that partially fills the trenches 140, are performed; whereas, in respect of the flowchart shown in FIG. 2 (b), a mask 400 is formed first on a substrate, so as to cover a region where a gate structure is to be formed, then trenches 140 are formed through etching, and metal sidewall spacers 160 are formed within the trenches 140; noticeably, the difference lies in that the mask is removed after formation of metal sidewall spacers 160, then a gate structure 200 is formed at the region where the mask has been removed, and then subsequent processes such as forming an insulating layer 150 that partially fills the trench 140 are performed.

The steps for forming and removing a mask is described in detail here below, while other steps same as those in the flowchart illustrated in FIG. 2 (a) may be referred to from the related foregoing description, thus are not described here in order not to obscure.

As shown in FIG. 12, an SOI substrate is overlaid with a mask 400, wherein photoresist is usually used as the mask. Next, the photoresist mask is patterned by means of lithography process; then, a desired shape is formed from the patterned photoresist mask through etching process, which is namely the shape of the gate line in the present invention. Then, trenches 140 are formed through etching, whose depth is in the range of 50 nm-150 nm. The trenches 140 partially expose isolation regions 120 of the SOI substrate.

As shown in FIG. 13, metal sidewall spacers 160 are formed within the trenches 140. The materials for the metal sidewall spacers 160 may be a material selected from a group consisting of W, Al, TiAl, and TiN, or combinations thereof.

As shown in FIG. 14, a gate structure 200 is formed on the region previously covered by said mask, and an insulating layer 150 partially filling the trenches 140 is formed. It is noteworthy at formation of a gate structure 200 that, since gate lines are formed first on the SOI, the gate lines have to be cut through to form the gate structure 200. Optionally, sidewall spacers 210 may be further formed on both sides of the gate structure 200.

As step S205~step S207 are same as or similar to steps S104~S106, and the materials, processes and flowcharts needed are all described in the foregoing text, thus they are not described in detail here in order not to obscure.

According to the semiconductor structure and the method for manufacturing the same provided by the present invention, trenches 140 extending into a BOX layer 110 is formed first on an SOI substrate, then metal sidewall spacers 160 are formed on sidewalls of the trenches 140, and contact vias 330 in contact with the metal sidewall spacers 160 are formed finally; accordingly, following advantages are achieved: since the contact vias 330 are in direct contact with the metal sidewall spacers 160, thus the contact resistance at the source/drain regions are relatively small, which therefore is favorable for enhancing performance of a semiconductor device; as the source/drain regions are formed within the SOI layer 100 under the gate structure 200, thus the gate is far from the source/drain regions and the capacitance between the two is small, which is also favorable for improving performance of a semiconductor device; additionally, self-alignment is fulfilled at formation of the contact vias 330, which therefore alleviates the difficulty of manufacturing a semiconductor device.

Although exemplary embodiments and their advantages have been described herein in detail, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, comprising:
   a) providing an SOI substrate, and forming a gate structure (200) on the SOI substrate;
   b) etching an SOI layer (100) and a BOX layer (110) of the SOI substrate on both sides of the gate structure (200) to form trenches (140) which expose the BOX layer (110) and partially extend into the BOX layer (110);
   c) forming metal sidewall spacers (160) on sidewalls of the trenches (140), wherein the metal sidewall spacers (160) are in contact with the SOI layer (100) under the gate structure (200);

d) forming an insulating layer (150) to partially fill the trenches (140), and forming a dielectric layer (300) to cover the gate structure (200) and the insulating layer (150);

e) etching the dielectric layer (300) to form first contact through holes (310) which at least partially expose the insulating layer (150), and etching the insulating layer (150) from the first contact through holes (310) to form second contact through holes (320) which at least partially expose the metal sidewall spacer (160); and f) filling the first contact through holes (310) and the second contact through holes (320) to form contact vias (330), which are in contact with the metal sidewall spacers (160).

2. The method of claim 1, wherein after formation of the dielectric layer (300), the method further comprises:
planarizing the dielectric layer (300) such that the upper surface of the dielectric layer (300) is at the same level with the upper surface of the gate structure (200).

3. The method of claim 1, wherein:
the material of the insulating layer (150) and the material of the dielectric layer (300) have different etching rates.

4. The method of claim 1, wherein:
the depth of the trenches is in the range of about 50 nm-150 nm.

5. The method of claim 1, wherein:
isolation regions (120) of the SOI substrate are partially exposed in the trenches (140).

6. The method of claim 1, wherein:
the material for the metal sidewall spacer (160) is selected from a group consisting of W, Al, TiAl, and TiN, or combinations thereof.

7. The method of claim 1, wherein:
the material for the contact vias (330) is a material selected from a group consisting of W, Al, TiAl, and TiN, or combinations thereof.

8. The method of claim 1, wherein:
the method for etching the dielectric layer (300) is dry etching, and the method for etching the insulating layer (150) is wet etching.

9. A method for manufacturing a semiconductor structure, comprising:
a) providing an SOI substrate which is covered with a mask (400), wherein gate lines are to be formed in the covered region defined by the mask;

b) etching an SOI layer (100) and a BOX layer (110) of the SOI substrates on both sides of the mask (400) to form trenches which expose the BOX layer (110) and partially extend into the BOX layer (110);

c) forming metal sidewall spacers (160) on sidewalls of the trenches (140), wherein the metal sidewall spacers (160) are in contact with the SOI layer (100) under the region covered by the mask;

d) removing the mask to expose the covered region, forming a gate structure (200) on said region, and partially filling the trenches (140) to form an insulating layer (150);

e) forming a dielectric layer (300) to cover the gate structure (200) and the insulating layer (150);

f) etching the dielectric layer (300) to form first contact through holes (310) which at least partially expose the insulating layer (150), and etching the insulating layer (150) from the first contact through holes (310) to form second contact through holes (320) which at least partially expose the metal sidewall spacers (160); and g) filling the first contact through holes (310) and the second contact through holes (320) to form contact vias (330), which are in contact with the metal sidewall spacers (160).

10. The method of claim 9, wherein after formation of the dielectric layer (300), the method further comprises:
planarizing the dielectric layer (300) such that the upper surface of the dielectric layer (300) is at the same level with the upper surface of the gate structure (200).

11. The method of claim 9, wherein:
the material of the insulating layer (150) and the material of the dielectric layer (300) have different etching rates.

12. The method of claim 9, wherein:
isolation regions (120) of the SOI substrate are partially exposed in the trenches (140).

* * * * *